US012684921B2

(12) United States Patent
Pinos et al.

(10) Patent No.: US 12,684,921 B2
(45) Date of Patent: Jul. 14, 2026

(54) LED PRECURSOR

(71) Applicant: PLESSEY SEMICONDUCTORS LIMITED, Plymouth (GB)

(72) Inventors: Andrea Pinos, Plymouth (GB); Wei Sin Tan, Plymouth (GB); Jun Youn Kim, Plymouth (GB); Xiang Yu, Plymouth (GB); Simon Ashton, Plymouth (GB); Samir Mezouari, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 686 days.

(21) Appl. No.: 17/909,164

(22) PCT Filed: Mar. 25, 2021

(86) PCT No.: PCT/EP2021/057711
§ 371 (c)(1),
(2) Date: Sep. 2, 2022

(87) PCT Pub. No.: WO2021/198008
PCT Pub. Date: Oct. 7, 2021

(65) Prior Publication Data
US 2023/0238421 A1 Jul. 27, 2023

(30) Foreign Application Priority Data
Mar. 30, 2020 (GB) ..................................... 2004595

(51) Int. Cl.
*H10H 29/14* (2025.01)
(52) U.S. Cl.
CPC .................................. *H10H 29/142* (2025.01)
(58) Field of Classification Search
CPC ........ H01L 21/02203; H01L 21/31695; H10H 20/013–0137; H10H 20/824–8252
See application file for complete search history.

(56) References Cited

U.S. PATENT DOCUMENTS

| | | | |
|---|---|---|---|
| 10,458,038 | B2 | 10/2019 | Zhang et al. |
| 2009/0001416 | A1 | 1/2009 | Chua et al. |

(Continued)

FOREIGN PATENT DOCUMENTS

| | | |
|---|---|---|
| CN | 1732557 A1 | 9/2010 |
| CN | 105702725 A | 6/2016 |
| WO | 2019063957 A1 | 4/2019 |

OTHER PUBLICATIONS

Lee-Woon Jang et al., "Electrical and structural properties of GaN films and GaN/InGaN light-emitting diodes grown on porous GaN templates fabricated by combined electrochemical and photoelectrochemical etching", Journal of Alloys and Compounds, vol. 589, 2014, pp. 507-512, ISSN 0925-8388. (Year: 2014).*

(Continued)

*Primary Examiner* — Matthew C Landau
*Assistant Examiner* — Nora T. Nix
(74) *Attorney, Agent, or Firm* — Stinson LLP

(57) ABSTRACT

A method of manufacturing a LED precursor and a LED precursor is provided. The LED precursor is manufactured by forming a monolithic growth stack having a growth surface and forming a monolithic LED stack on the growth surface. The monolithic growth stack comprises a first semiconducting layer comprising a Group III-nitride, a second semiconducting layer, and third semiconducting layer. The second semiconducting layer comprises a first Group III-nitride including a donor dopant such that the second semiconducting layer has a donor density of at least 5×1018 cm-3. The second semiconducting layer has an areal porosity of at least 15% and a first in-plane lattice constant. The third semiconducting layer comprises a second Group III-nitride different to the first Group-III-nitride. The monolithic growth stack comprises a mesa structure comprising the third semiconducting layer such that the growth surface comprises a mesa surface of third semiconducting layer and (Continued)

a sidewall surface of the third semiconducting layer encircling the mesa surface. The sidewall surface of the third semiconducting layer is inclined relative to the mesa surface. The mesa surface of the third semiconducting layer has a second in-plane lattice constant which is greater than the first in-plane lattice constant.

25 Claims, 5 Drawing Sheets

(56) References Cited

U.S. PATENT DOCUMENTS

| | | |
|---|---|---|
| 2009/0140274 A1 | 6/2009 | Wierer, Jr. et al. |
| 2015/0084058 A1 | 3/2015 | Singh et al. |

| | | | |
|---|---|---|---|
| 2018/0152003 A1 | 5/2018 | Han et al. | |
| 2018/0219087 A1 | 8/2018 | Dasgupta et al. | |
| 2021/0193870 A1* | 6/2021 | Pernel | H10H 20/8242 |
| 2021/0193873 A1* | 6/2021 | Pernel | H10H 20/8252 |
| 2021/0265418 A1 | 8/2021 | Pinos et al. | |
| 2022/0246797 A1* | 8/2022 | Bi | H10H 20/01335 |

OTHER PUBLICATIONS

International Search Report, PCT/EP2021/057711, dated Jul. 6, 2021, 3 pages.
Written Opinion, PCT/EP2021/057711, dated Jul. 6, 2021, 6 pages.
Taiwanese Search Report, Application No. 110110503, dated Oct. 27, 2021, 7 pages.
Great Britain Search Report, Application No. GB2004595.1, dated Sep. 8, 2020, 5 pages.

* cited by examiner

LED PRECURSOR

REFERENCE TO RELATED APPLICATIONS

This application is the 371 U.S. national stage application of International Patent Application No. PCT/EP2021/057711, filed Mar. 25, 2021, which claims the benefit of Great Britain Patent Application No. 2004595.1, filed Mar. 30, 2020, the entire disclosures of which are incorporated herein by reference.

FIELD OF THE DISCLOSURE

The present disclosure relates to Light Emitting Diodes (LEDs). In particular, the present disclosure relates to LEDs comprising Group III-nitrides.

BACKGROUND

Micro LED arrays are commonly defined as LEDs with a size of 100×100 μm2 or less. Micro LEDs may be assembled to form a two dimensional micro LED array. Micro LED arrays may form a self-emitting display or projector which may be suitable for use in a variety of devices such as smartwatches, head-wearing displays, head-up displays, camcorders, viewfinders, multisite excitation sources, and pico-projectors.

In many applications it is desirable to provide a micro-display/projector capable of outputting light having a range of wavelengths. For example, in many colour displays it is common to provide each pixel with the ability to output a combination of red, green, and blue light.

One known form of a micro-LED array comprises a plurality of LEDs formed from Group III-nitrides. Group III-nitride LEDs are inorganic semiconductor LEDs containing GaN and its alloys with InN and AlN in the active light-emitting region. Group III-nitride LEDs can be driven at significantly higher current density and emit a higher optical power density than conventional large-area LEDs, for example organic light emitting diodes (OLED) in which the light-emitting layer is an organic compound. As a result, higher luminance (brightness), defined as the amount of light emitted per unit area of the light source in a given direction, makes micro LEDs suitable for applications requiring or benefiting from high brightness. For example, applications which benefit from high brightness may include displays in high brightness environments or projectors. Additionally, Group III-nitride micro LEDs are known to have relatively high luminous efficacy, expressed in lumens per watt (lm/W) compared to other conventional light sources. The relatively high luminous efficacy of III-nitride micro LED arrays reduces power usage compared with other light sources and makes micro LEDs particularly suitable for portable devices.

One known type of Group III-nitride LEDs utilise the In—Ga— N alloy system to define multiple quantum wells in an active region of an LED. Typically, alternating layers of GaN and $In_xGa_{1-x}N$ are provided to define the quantum wells. For blue LEDs, the Indium mole fraction, X is typically <0.2. Increasing the amount of Indium incorporated into the $In_xGa_{1-x}N$ layers increases the depth of the potential well, thereby increasing the wavelength of the light emitted by the LED.

It is known that increasing the Indium mole fraction X above 0.2, for example, to provide native green and red LEDs significantly reduces the efficiency of the LED. One of the fundamental issues is the low incorporation efficiency of Indium if deposited on relaxed or compressively strained GaN. High In-content $In_xGa_{1-x}N$ layers (i.e. X>0.2) are generally formed using low growth temperatures and are prone to phase segregation with detrimental effects on the IQE (for example JOURNAL OF APPLIED PHYSICS 123, 160901 (2018)).

In particular, in order to form native red LEDs (i.e. LEDs with a peak emission wavelength in the range 600 nm to 680 nm) the active region of the LED typically includes $In_xGa_{1-x}$ N layers where X≥0.3. The strain resulting from $In_xGa_{1-x}N$ layers of such an In-content may result in the formation of defects, which in turn reduces the efficiency of the LEDs.

"InGaN lattice constant engineering via growth on (In, Ga)N/GaN nanostripe arrays", Keller S. et al., Semicond. Sci. Technol., vol. 30, (2015), discloses planar (In, Ga)N layers grown on nanostripe arrays composed of InGaN/GaN multiple quantum wells. The nanostripe arrays exhibited elastic relaxation perpendicular to the stripe direction after pattern fabrication, resulting in an a⊥ lattice constant perpendicular to the stripe direction larger than that of the GaN base layer.

It is an object of the present invention to provide an improved method for forming a LED precursor, as well as improved LED precursors which tackle at least one of the problems associated with prior art methods and arrays, or at least, provide a commercially useful alternative thereto.

SUMMARY

The present inventors have realised that in order to improve the efficiency of LEDs comprising Group III-nitrides, the formation of defects resulting from strain between the active layer and the layers of the LED precursor on which the active layer is deposited should be reduced. The present inventors have realised that by providing a strain-relaxed growth surface for the active layer having an in-plane lattice constant which more closely matches the (unstrained) in-plane lattice constant of the active layer, the strain at the interface may be reduced. This in turn may reduce the formation of defects at the interface and thus improve the efficiency of the LED precursor.

According to a first aspect of the disclosure, a LED precursor is provided. The method comprises: a) forming a monolithic growth stack having a growth surface, and b) forming a monolithic LED stack on the growth surface of the monolithic growth stack.

Forming the monolithic growth stack comprises: forming a first semiconducting layer comprising a Group III-nitride, forming a second semiconducting layer, forming a second semiconducting layer on the first semiconducting layer, the second semiconducting layer comprising a first Group III-nitride including a donor dopant such that the second semiconducting layer has a donor density of at least $5 \times 10^{18}$ $cm^{-3}$, and forming a third semiconducting layer on an opposite side of the second semiconducting layer to the first semiconducting layer. A portion of the third semiconducting layer is selectively removed from the growth surface. The third semiconducting layer is selectively removed through a thickness of the third semiconducting layer such that the growth surface of the monolithic growth stack comprises a mesa surface of the third semiconducting layer and a sidewall surface of the third semiconducting layer encircling the mesa surface. The third semiconducting layer provides the growth surface of the monolithic growth stack, the third semiconducting layer comprising a second Group III-nitride different to the first Group-Ill-nitride such that the third semiconducting layer is formed on the second semiconducting layer under compressive strain. Following the formation of the third semiconducting layer the second semiconducting layer is subjected to a porosity treatment to increase an areal porosity of the second semiconducting layer to at least 15%, and the third semiconducting layer is heated to a strain relaxing temperature such that the third semiconducting layer relaxes such that an in-plane lattice constant of the mesa surface increases.

Forming the monolithic LED stack comprises: forming a fourth semiconducting layer comprising a Group III-nitride on the growth surface of the monolithic growth stack, such that the fourth semiconducting layer covers the mesa surface of the third semiconducting layer, forming an active layer on the fourth semiconducting layer, the active layer comprising a plurality of quantum well layers, each quantum well layer comprising a Group III-nitride, and forming a p-type semiconducting layer comprising a Group III-nitride on the active layer.

The LED precursor according to the presently claimed invention provides a monolithic growth stack having a growth surface. The growth stack comprises a plurality of Group III-nitride layers. The growth surface is suitable for the formation of a monolithic LED stack comprising a plurality of Group III-nitride layers thereon. In particular, the growth surface is suitable for the formation of mono-lithic LED stack for a native red or green LED. The growth stack comprises three semiconducting layers, a first, second and third semiconducting layer. The third semiconducting layer has a different composition to the second semicon-ducting layer on which it is formed. As a result, the third semiconducting layer is formed on the second semiconduct-ing layer under a compressive stress. That is to say, the lattice structure of the third semiconducting layer is subject to a compressive strain from the lattice structure of the second semiconducting layer.

The selective removal of the third semiconducting layer provides growth surface comprising a mesa surface. As such, the monolithic growth stack is patterned into a mesa structure over which the monolithic LED stack can be overgrown. By overgrowing the monolithic LED stack on the mesa structure of the monolithic growth stack, a LED precursor may be formed using a method which does not require etching of the LED junction. Methods of forming an LED precursor which avoid etching the sidewall surfaces of an LED junction may result in a reduction or elimination of defects formed on sidewall surfaces of the LED junction, thereby improving the EQE of the LED.

The heat treatment process allows the third semiconduct-ing layer to relax its compressive strain by plastic deforma-tion in the porous semiconducting layer such that the in plane lattice constant of the third semiconducting layer increases (relative to the in-plane lattice constant of the as-deposited third semiconducting layer. The plastic defor-mation (formation and movement of misfit dislocation) in the porous semiconducting layer occurs close to the inter-face between the porous semiconducting layer and the semiconducting layer. The presence of voids and abundance of dangling bonds reduce mechanical toughness in the porous semiconducting layer which aids misfit dislocation formation and movement. Hence the third semiconductor layer can strain relax more easily on the third semiconduct-ing layer. By providing the growth surface of the monolithic growth stack with an increased in-plane lattice constant, the in-plane lattice constant of the growth surface may reduce and/or eliminate strain at the interface between the mono-lithic growth stack and the monolithic LED stack. Thus, the formation of defects at the interface may be reduced and/or eliminated thereby improving the efficiency of the LED precursor.

The heat treatment step is provided to cause strain relax-ation of the third semiconducting layer, which is formed under compressive strain. However, excessive strain relax-ation of compressively strained layers may result in buckling and/or delamination of the compressively strained layer due to the difference in unstrained in-plane lattice constants of the second and third semiconducting layers. As such, the method according to the first aspect provides features which provide for increased strain relaxation whilst reducing or eliminating the occurrence of buckling and/or delamination at the interface between the second and third semiconduct-ing layers.

One important feature is that the second semiconducting layer is subjected to an etching treatment in order to provide the second semiconducting layer with an areal porosity of at least 15%. As such, the second semiconducting layer is a relatively porous layer. The porosity of the second semicon-ducting layer provides localised regions at the interface between the second and third semiconducting layer in which the strain in the third semiconducting layer may be reduced. Importantly, the provision of the porous semiconducting layer 14' allows for the propagation of misfit dislocations in the porous semiconducting layer 14' as half loop disloca-tions. As such, the porous semiconducting layer 14' may undergo plastic deformation during the heat treatment step which results in the preferential propagation of half loop dislocations in the porous semiconducting layer 14' rather than the propagation of threading dislocations in the third semiconducting layer 16. The formation of half-loop dislo-cations in the porous semiconducting layer 14' allows the third semiconducting layer 16 to strain-relax to provide an improved growth surface for the monolithic LED stack.

The inventors have also realised that as the second and third semiconducting layers may be formed as generally continuous layers, for example layers extending over an area of at least 30×30 μm, it is important for the third semicon-ducting layer to have sufficient space to relax into. Layers which attempt to strain relax without sufficient (lateral) volume into which they can relax (expand) may be prone to buckling. By selectively removing portions of the third semiconducting layer, the remaining portions of the third semiconducting layer may relax into the free space resulting from the selective removal process. That is to say, the sidewall surfaces of the third semiconducting layer have room to (laterally) strain relax into.

In some embodiments the second semiconducting layer comprises GaN. For example, in some embodiments the second semiconducting layer may comprise substantially undoped GaN (i.e. not intentionally doped GaN). In some embodiments, the third semiconducting layer comprises $In_xGa_{1-x}N$, where $0<X\leq1$. Accordingly in some embodi-ments the second and third semiconducting layers may be provided such that the third semiconducting layer is formed on the second semiconducting layer under compressive strain. By forming the third semiconducting layer under compressive strain, the monolithic growth stack may then subsequently be processed in order to strain relax such that a strain relaxed growth surface is provided for the formation of the monolithic LED stack. The strain relaxed growth surface may have an in-plane lattice constant which more closely matches the unstrained lattice constant of the active layer, in particular for active layers configured to emit light having a wavelength of at least 525 nm (i.e. green or red visible light).

For example, in some embodiments each quantum well layer of the active layer comprises $In_zGa_{1-z}N$, where $0.2 \leq Z \leq 0.5$. As such, the active layer may be configured to emit light have a peak emission wavelength of at least 525 nm. In some embodiments, each quantum well layer of the active layer comprises $In_zGa_{1-z}N$, where $0.3 \leq Z \leq 0.5$. As such, the active layer may be configured to emit light have a peak emission wavelength of at least 600 nm.

In some embodiments a thickness of the third semiconducting layer in a direction normal to the growth surface of the monolithic growth stack is at least 200 nm.

In some embodiments, the second semiconducting layer is subjected to the porosity treatment prior to selectively removing a portion of the third semiconducting layer from the growth surface. As such, the porosity treatment process may be performed prior to any patterning of the layers forming the monolithic growth stack.

In some embodiments, the third semiconducting layer is selectively removed such that the growth surface of the monolithic growth stack comprises a surface of the second semiconducting layer. For example, in some embodiments the monolithic growth stack may comprise a surface of the second semiconducting layer which is generally parallel to the mesa surface of the third semiconducting layer. In some embodiments selectively removing the third semiconducting layer may allow the formation of a mesa structure wherein the third semiconducting layer comprises a mesa surface which is encircled by a sidewall surface. The sidewall surface of the mesa structure may be encircled by a bulk semiconducting surface of the second semiconducting layer. As such, the mesa surface and the sidewall surface of the third semiconducting layer and the bulk semiconducting surface of the second semiconducting layer provide the growth surface on which the monolithic LED stack may be formed.

In some embodiments, forming the monolithic growth stack further comprises selectively removing a portion of the second semiconducting layer aligned with the portion of the third semiconducting layer which is removed, such that the growth surface of the monolithic growth stack comprises a sidewall surface of the second semiconducting. As such, a mesa structure may be formed which extends from a surface of the first semiconducting layer in a direction generally normal to the surface of the first semiconducting layer.

In some embodiments the second semiconducting layer is selectively removed such that the sidewall surface of the second semiconducting layer is aligned with the sidewall surface of the third semiconducting layer. As such, the sidewall surface of the third semiconducting layer and the sidewall surface of the second semiconducting layer extend in a generally coplanar direction. For example, in some embodiments the sidewall surface of the second semiconducting layer and the sidewall surface of the third semiconducting layer may extend in a direction generally normal to the mesa surface of the third semiconducting layer.

In some embodiments the second semiconducting layer is selectively removed such that the growth surface comprises a portion of a surface of the first semiconducting layer.

In some embodiments, the fourth semiconducting layer comprises GaN. In some embodiments, the fourth semiconducting layer may also comprise a n-type dopant, such that the fourth semiconducting layer is a n-type semiconductor. In other embodiments, the fourth semiconducting layer may be an undoped semiconducting layer (i.e. not intentionally doped).

In some embodiments, the fourth semiconducting layer is formed on the growth surface to provide an inclined sidewall portion extending from a first portion of the fourth semiconducting layer on the mesa surface of the third semiconducting layer towards the second semiconducting layer. As such, the fourth semiconducting layer may form a generally trapezoidal cross section.

In some embodiments, forming the monolithic growth stack further comprises selectively forming a masking layer on the growth surface of the monolithic growth stack. The masking layer may comprise an aperture aligned with the mesa surface of the monolithic growth stack. Accordingly the provision of the masking layer on a portion of the growth surface may prevent or reduce growth of the monolithic LED stack on regions other than the mesa surface of the growth surface. Accordingly, the provision of the masking layer may provide a method of forming a monolithic LED stack whilst avoiding the use of etching of the monolithic LED stack to pattern the LED junction.

In some embodiments the monolithic LED stack is selectively formed on the mesa surface of the monolithic growth stack and not on the growth surface covered by the masking layer.

According to a second aspect of the disclosure an LED precursor is provided. The LED precursor comprises a monolithic growth stack having a growth surface and a monolithic LED stack provided on the growth surface of the monolithic growth stack. The monolithic growth stack comprises a first semiconducting layer, a second semiconducting layer, and a third semiconducting layer. The first semiconducting layer comprises a Group III-nitride. The second semiconducting layer is provided on the first semiconducting layer. The second semiconducting layer comprises a first Group III-nitride including a donor dopant such that the second semiconducting layer has donor density of at least $5 \times 10^{18}$ cm$^{-3}$. The second semiconducting layer has an aerial porosity of at least 15% and a first in-plane lattice constant. The third semiconducting layer is provided on an opposite side of the second semiconducting layer to the first semiconducting layer. The third semiconducting layer comprises a second Group III-nitride different to the first Group III-nitride. The monolithic growth stack comprises a mesa structure comprising the third semiconducting layer such that the growth surface comprises a mesa surface of third semiconducting layer and a sidewall surface of the third semiconducting layer encircling the mesa surface, the sidewall surface of the third semiconducting layer inclined relative to the mesa surface. The mesa surface of the third semiconducting layer has a second in-plane lattice constant which is greater than the first in-plane lattice constant. The monolithic LED stack comprises a fourth semiconducting layer, an active layer and a p-type semiconducting layer. The fourth semiconducting layer is provided on the growth surface of the monolithic growth stack such that the fourth semiconducting layer covers the mesa surface of the third semiconducting layer and the sidewall surface of the third semiconducting layer. The active layer comprises a plurality of quantum well layers. Each quantum well layer comprises a Group III-nitride. The p-type semiconducting layer comprises a Group III-nitride provided on the active layer.

As such, the LED precursor according to the second aspect of the disclosure may be formed using the method of the first aspect. Accordingly, the LED precursor according to the second aspect of the disclosure may include all of the advantages and optional features of the first aspect described above.

In particular, the monolithic LED stack may be formed by overgrowing the monolithic LED stack on the mesa structure of the monolithic growth stack. Accordingly, the LED precursor may be formed using a method which does not require etching of the sidewall surfaces of the LED junction. Methods of forming an LED precursor which avoid etching the sidewall surfaces of an LED junction may result in a reduction or elimination of defects formed on sidewall surfaces of the LED junction, thereby improving the EQE of the LED.

In some embodiments, the second semiconducting layer comprises GaN. In some embodiments, the third semiconducting layer comprises $In_XGa_{1-X}N$, where $0<X\leq1$. As such, in some embodiments, the In context (X) of the third semiconducting layer may be controlled in order to provide a desired in-plane lattice constant for the third semiconducting layer following the heat treatment process. In particular, in some embodiments, the third semiconducting layer comprises $In_XGa_{1-X}N$, where $0.2\leq X\leq0.5$, such that the third semiconducting layer provides a growth surface which is particularly suited for the formation of active layers thereon which peak emission wavelengths in the green or red visible light spectrum (e.g. peak emission wavelengths of at least 525 nm).

For example, in some embodiments each quantum well layer of the active layer comprises $In_ZGa_{1-Z}N$, where $0.2\leq Z\leq0.5$. As such, the active layer may be configured to emit light have a peak emission wavelength of at least 525 nm. In some embodiments, each quantum well layer of the active layer comprises $In_ZGa_{1-Z}N$, where $0.3\leq Z\leq0.5$. As such, the active layer may be configured to emit light have a peak emission wavelength of at least 600 nm.

In some embodiments, the sidewall surface of the third semiconducting layer is inclined in a direction transverse to the mesa surface. As such, the sidewall surface of the third semiconducting layer may extend in a direction generally normal to the first semiconducting layer.

In some embodiments, the mesa structure extends from the porous semiconducting layer such that growth surface comprises the porous semiconducting layer.

In some embodiments, the growth surface of the monolithic growth stack comprises a sidewall surface of the porous semiconducting layer aligned with the sidewall surface of the third semiconducting layer.

In some embodiments, the mesa structure extends from the first semiconducting layer such that the growth surface comprises a portion of a surface of the first semiconducting layer.

In some embodiments, the fourth semiconducting layer comprises GaN.

In some embodiments, the fourth semiconducting layer is provided on the growth surface to provide an inclined sidewall portion extending from a mesa portion of the fourth semiconducting layer on the mesa surface of the third semiconducting layer towards the second semiconducting layer.

In some embodiments, the monolithic growth stack further comprises a masking layer provided on the growth surface of the monolithic growth stack, the masking layer comprising an aperture aligned with the mesa surface of the monolithic growth stack.

In some embodiments, the monolithic LED stack is selectively provided only on the mesa surface of the monolithic growth stack.

The LED precursor, and the methods of forming the LED precursor according to the first and second aspects of the disclosure may, in some embodiments provide a LED array precursor comprising a plurality of LED precursors and a method of forming thereof. The plurality of LED precursors may be arranged in a two-dimensional array in which each of the LED precursors are spaced apart from the other LED precursors.

The LED precursor, LED array precursor, and the methods of forming the LED precursor and LED array precursor according to the first and second aspects of the disclosure may, in some embodiments provide micro LED precursors and micro LED array precursors. A micro LED array precursor is an array of micro LED precursors. A micro LED precursor may comprise a monolithic LED stack which has a surface area dimension in a plane aligned with the first semiconducting layer of less than 100 μm×100 μm. For example, in some embodiments, the micro LED precursors may have a surface area of less than $10^{-8}$ $m^2$.

BRIEF DESCRIPTION OF THE FIGURES

The disclosure will now be described in relation to the following non-limiting figures. Further advantages of the disclosure are apparent by reference to the detailed description when considered in conjunction with the figures in which.

DETAILED DESCRIPTION

Figure 1:
FIG. 1 shows a diagram of an intermediate stage of forming the monolithic growth stack according to a first embodiment of the disclosure.

According to a first embodiment, a method for forming a LED precursor 1 is provided.

By the term "precursor" in LED precursor, it is noted that the LED precursor described does not necessarily include the electrical contacts for the LED such as to allow the emission of light, nor the associated circuitry. Of course, the method of forming the LED precursor of the first embodiment does not preclude the addition of further electrical contacts and associated circuitry. As such use of the term precursor in this disclosure is intended to include the finalised product (i.e. a LED, a LED array etc.).

FIGS. 1 to 5 show diagrams of the LED precursor as it is formed according to the method of the first embodiment. The method according to the first embodiment comprises forming a monolithic growth stack 10 and a monolithic LED stack 20. The monolithic LED stack 20 is formed on a growth surface 11 of the monolithic growth stack 10. According to the method of the first embodiment, the monolithic growth stack 10 comprises a first semiconducting layer 12, a second semiconducting layer 14, and a third semiconducting layer 16.

A monolithic growth stack refers to the provision of a stack of layers forming a growth surface for an LED which are formed as a single piece. That is to say, the monolithic growth stack 10 is formed as a single piece.

A monolithic LED stack refers to the provision of a stack of layers forming an LED which are formed as a single piece. That is to say, the monolithic LED stack is formed as a single piece on the growth surface 11 of the monolithic growth stack 10.

In the method of the first embodiment, a plurality of LED precursors 1 are formed in a single formation process. The plurality of LED precursors 1 are formed as an array of LED precursors. As such, the method according to the first embodiment provides a method of forming a LED array precursor comprising a plurality of LED precursors.

As shown in FIG. 1, forming the monolithic growth stack 10 comprises forming a first semiconducting layer 12. In the embodiment of FIG. 1 the first semiconducting layer 12 comprises a Group III-nitride. For example, the first semiconducting layer may comprise GaN. In some embodiments, the first semiconducting layer may be an undoped semiconducting layer (i.e. not intentionally doped). In other embodiments, the first semiconducting layer 12 may be a doped semiconducting layer (e.g. comprising an n-type dopant such as Si).

The first semiconducting layer 12 may be formed on a substrate (not shown in FIG. 1). The substrate may provide a growth surface for the first semiconducting layer 12. The substrate may be a substantially planar substrate. The substrate may have an in-plane lattice constant which is configured to correspond to the in-plane lattice constant of the first semiconducting layer 12 to reduce lattice mismatch. Various substrates suitable for the growth of a first semiconducting layer 12 comprising a Group III-nitride are known to the skilled person. For example, the substrate may be a sapphire substrate, or a silicon substrate. The substrate may comprise one or more buffer layers configured to provide a substrate surface suitable for the formation of Group III-nitride layers. The substrate may be provided such that the first semiconducting layer 12 is grown on the substrate such that a (0001) crystal plane of the first semiconducting layer 12 is aligned with the substrate surface. As such, the first semiconducting layer 12 may have a (0001) crystal plane orientation.

The first semiconducting layer may be formed using any suitable process for the fabrication of Group III nitride semiconducting layers. For example, the first semiconducting layer 12 may be formed using a Metal Organic Chemical Vapour Deposition process (MOCVD), or a Molecular Beam Epitaxy (MBE) process.

As shown in FIG. 1, a second semiconducting layer 14 is formed on the first semiconducting layer 12. The second semiconducting layer 14 is formed on a first surface 13 of the first semiconducting layer 12. The first semiconducting surface 13 is the surface of the first semiconducting layer 12 which is provided on an opposite side of the first semiconducting layer 12 to the substrate. As such, the first semiconducting layer 12 is provided between the second semiconducting layer 14 and the substrate.

The second semiconducting layer 14 comprises a Group III-nitride. The second semiconducting layer 14 has a first composition including a donor dopant, such that the second semiconducting layer has a donor density of at least $5\times10^{18}$ cm$^{-3}$. In some embodiments, the donor density of the second semiconducting layer may be at least: $1\times10^{19}$ cm$^{-3}$, $3\times10^{19}$ cm$^{-3}$, $5\times10^{19}$ cm$^{-3}$, $7\times10^{19}$ cm$^{-3}$, or $1\times10^{20}$ cm$^{-3}$. As such, the second semiconducting layer 14 is an n-type semiconducting layer. In particular, the second semiconducting layer 14 has a higher donor dopant density than the first semiconducting layer 12. The second semiconducting layer 14 may comprise any suitable donor dopant. For example, the second semiconducting layer 14 may comprise a donor dopant including at least one of: Si, and Ge. The second semiconducting layer 14 is provided with a relatively high donor density in order to allow for targeted formation of pores in the porosity treatment step described below. By providing the second semiconducting layer 14 with a relatively high donor dopant density the porosity treatment selectively targets the second semiconducting layer 14.

The second semiconducting layer 14 may be formed at a substantially continuous layer across the major surface of the first semiconducting layer 12. As such, the first and second semiconducting layers 12, 14 may be provided substantially continuously across a substrate. The second semiconducting layer 14 has a second surface 15 on an opposite side of the second semiconducting layer 14 to the first semiconducting layer 12.

The second surface 15 of the second semiconducting layer 14 has a first in-plane lattice constant. The second semiconducting layer 14 may have a wurtzite crystal structure. In some embodiments, the second semiconducting layer 14 may be formed on the first semiconducting layer 12 having a (0001) crystal plane provided parallel to the first surface 13. So, for second semiconducting layer 14 having a second surface aligned with a (0001) crystal plane, an in-plane lattice constant may be a constant reflecting the a (or b) lattice constants.

In some embodiments, the second semiconducting layer 14 may have a thickness in the direction normal to the substrate or at least 50 nm. In some embodiments, the second semiconducting layer 14 may have a thickness of no greater than 2000 nm.

In some embodiments the first semiconducting layer 12 may have a thickness of at least 100 nm. In some embodiments, the first semiconducting layer 12 may have thickness no greater than 2000 nm.

The second semiconducting layer 14 may be formed using any suitable process for the fabrication of Group III nitride semiconducting layers. For example, a MOCVD process or a MBE processes. As such, the second semiconducting layer 14 may be formed in a similar manner and using similar equipment to the first semiconducting layer 12.

Figure 2:
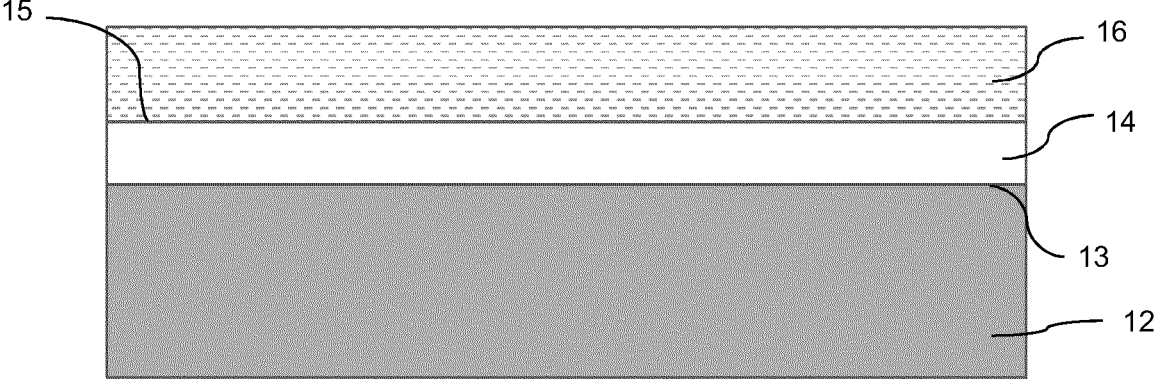
FIG. 2 shows a diagram of an intermediate stage of forming the monolithic growth stack according to the first embodiment of the disclosure.

As shown in FIG. 2, following the formation of the second semiconducting layer 14, the third semiconducting layer 16 is formed on a major surface of the second semiconducting layer 14. As such, the third semiconducting layer 16 is formed on an opposite side of the second semiconducting layer 14 to the first semiconducting layer 12. The third semiconducting layer 16 provides a growth surface 11 of the monolithic growth stack 10.

The third semiconducting layer 16 comprises a Group III-nitride. The third semiconducting layer 16 has a second composition which is different to the first composition of the second semiconducting layer 14. The difference in composition between the second semiconducting layer 14 and the third semiconducting layer 16 results in the formation of the third semiconducting layer 16 under compressive strain. That is to say, the difference in in-plane lattice constants of the second and third semiconducting layers results in the as-formed third semiconducting layer 16 being under compressive stain. As such, an in-plane lattice constant of an unstrained thin film having the second composition (of the third semiconducting layer 16) would be greater than an in-plane lattice constant of an unstrained thin film having the first composition (of the second semiconducting layer 14).

The third semiconducting layer 16 is formed with a crystal structure which may be coherent with the second semiconducting layer 14. As such, the interface between the third semiconducting layer 16 and the second semiconducting layer 14 may be a coherent interface. Following a heat treatment process (discussed in more detail below), the third semiconducting layer 16 relaxes to form a strain relaxed third semiconducting layer 16. The strain relaxed third semiconducting layer 16 has strain relaxed surface forming part of the growth surface 11 of the monolithic growth stack 10 with a second in-plane lattice constant. The second in-plane lattice constant is larger than the first in-plane lattice constant of the second semiconducting layer 14. In some embodiments, the strain relaxed third semiconducting layer 16 may have a wurtzite crystal structure, similar to the first and second semiconducting layers 12, 14. In some embodiments, the third semiconducting layer 16 may be formed on the first and second semiconducting layers 12, 14 with a (0001) crystal plane provided parallel to the first and second surfaces 13, 15.

For example, in the embodiment of FIG. 2, the third semiconducting layer 16 may comprise $In_XGa_{1-X}N$, where $0<X\leq1$. In particular, in some embodiments the third semiconducting layer 16 may comprise $In_XGa_{1-X}N$, where $0.03<X\leq0.2$. Accordingly, the In content of the third semiconducting layer 16 may be selected to provide an mesa surface with a desired in-plane lattice constant.

In the embodiment of FIG. 2, the first composition of the second semiconducting layer 14 comprises GaN. The second composition of the third semiconducting layer 16 may comprise $In_XGa_{1-X}N$, where $0<X\leq1$. Accordingly, the formation of the third semiconducting layer 16 having the second composition and the second semiconducting layer 14 having the first composition will result in the third semiconducting layer 16 being formed on the second semiconducting layer 12 under compressive strain.

In some embodiments, the third semiconducting layer 16 may be a substantially undoped layer. That is to say, the third semiconducting layer 16 may be formed without any intentional doping. For example, in the method of forming the first embodiments, the third semiconducting layer 16 is a substantially undoped layer. In some embodiments, the third semiconducting layer 16 may comprise a dopant, for example a donor dopant. In embodiments where the third semiconducting layer includes a dopant, the third semiconducting layer may be doped with a donor density no greater than the donor density of the second semiconducting layer 14. For example, in some embodiments, the donor density of the third semiconducting layer 15 may be no greater than: 50%, 25%, 10%, 5%, 1% or 0.1% of the donor density of the second semiconducting layer 14.

In some embodiments, the third semiconducting layer 16 may have a thickness of at least 200 nm. In some embodiments, the third semiconducting layer 16 may have thickness no greater than 10 μm. For example, the third semiconducting layer 16 in FIG. 2 may have a thickness of at least 1 μm and a thickness of no greater than 10 μm.

As shown in FIG. 2, the third semiconducting layer 16 is a bulk semiconducting layer formed from a substantially continuous layer of a Group III-nitride semiconductor. It will be appreciated that the third semiconducting layer 16 is provided in order to form a strain relaxed surface (growth surface 11) for the formation of the monolithic LED stack 20. In other embodiments, the third semiconducting layer 16 may comprise a plurality of Group III-nitride layers forming a superlattice structure. For example, the third semiconducting layer 16 may comprise a plurality of first and second Group III-nitride layers arranged in an alternating stack, wherein the first and second Group III-nitride layers have different lattice constants. For example, one example of a superlattice structure is an alternating stack of layers of $In_YGa_{1-Y}N$, where $0<Y\leq1$, and layers of GaN.

Following the formation of the third semiconducting layer 16, the second semiconducting layer 14 is subjected to a porosity treatment process in order to increase an areal porosity of the second semiconducting layer 14 to at least 15%. Methods for increasing the porosity of a Group III nitride layer are known to the skilled person. For example, "In-plane bandgap control in porous GaN through electroless wet chemical etching", Xiuling Li, Young Woon-Kim et al., Applied Physics Letters, Vol. 8, no. 6, 11 Feb. 2002, describes several processes for increasing the porosity of an n-type doped Group III-nitride layer.

In the methods according to this disclosure, the second semiconducting layer 14, which has a donor density of at least $5\times10^{18}$ $cm^{-3}$, may be selectively subjected to the porosity treatment to increase an areal porosity of the second semiconducting layer. The donor density of the second semiconducting layer allows the porosity treatment process to selectively increase the porosity of the second semiconducting layer 14.

For example, the porosity treatment may comprise subjecting the layers of the monolithic growth stack to an electrochemical treatment process. The electrochemical treatment process may comprise submerging the monolithic growth stack in a bath of oxalic acid. Electrical connections are made between the bath of oxalic acid and the monolithic growth stack 10. An electric current is passed between the electrical contacts of the oxalic acid bath and the monolithic growth stack in order to electrochemically form pores within the second semiconducting layer 14. In some embodiments, the oxalic acid baths comprises an oxalic acid solution having a concentration of between 0.03M and 0.3M. In other embodiments the oxalic acid bath may be substituted for other electrolytes such as KOH or HCl. The level of electrical bias applied to the electrochemical process will depend on the electrochemical solution used and the relative dimensions of the bath and the monolithic growth stack 10. Further examples of porosity treatments are described in ACS Applied Nano Materials, 2020, 3, 399-402 and US 2017/0237234.

The porosity treatment process results in the formation, or an increase in the size of, pores present in the second semiconducting layer 14. The porosity of the second semiconducting layer 14 may be characterised by an areal porosity. Areal porosity is the area fraction of pores present in a cross-section through the material (i.e. through the second semiconducting layer 14). In some embodiments, the porous semiconducting layer 14' has an areal porosity of at least 15%. In some embodiments, the porous semiconducting layer 14' has an areal porosity of at least 30%. By providing the porous semiconducting layer 14' with such an areal porosity, the third semiconducting may strain-relax to a greater degree during a subsequent heat treatment process. Importantly, the provision of the porous semiconducting layer 14' allows for the propagation of misfit dislocations in the porous semiconducting layer 14' as half loop dislocations. As such, the strain relaxation of the third semiconducting layer 16 results in the preferential propagation of half loop dislocations in the porous semiconducting layer 14' rather than the propagation of threading dislocations in the third semiconducting layer 16. Thus, the defect density in the third semiconducting layer 16 may be reduced by the provision of the porous semiconducting layer 14'.

In some embodiments, the porous semiconducting layer 14' has an areal porosity of no greater than 80%. In some embodiments, the porous semiconducting layer 14' has an areal porosity of no greater than 50%. Accordingly, the structural integrity of the porous semiconducting layer 14' may be maintained following the porosity treatment process.

Figure 3:
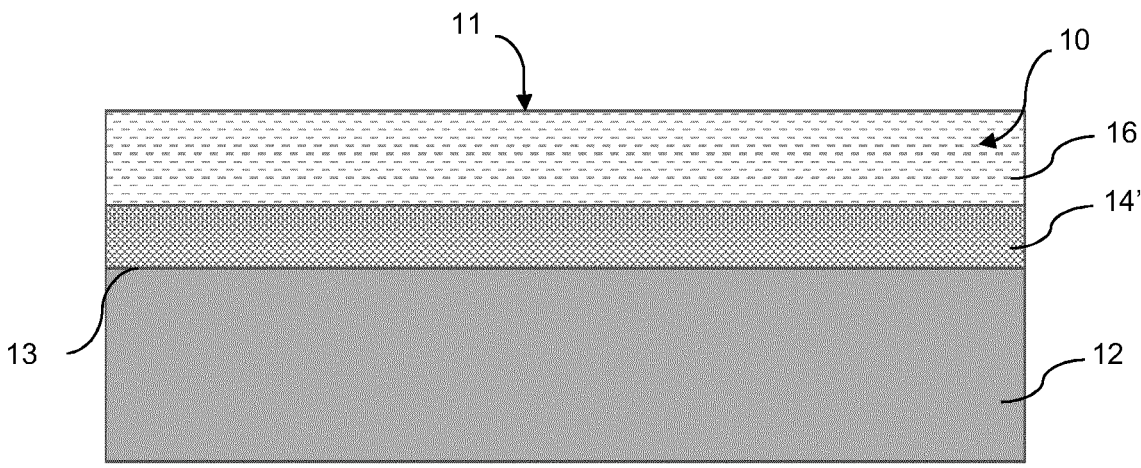
FIG. 3 shows a diagram of an intermediate stage of forming a monolithic growth stack according to the first embodiment of the disclosure.

As shown in FIG. 3, following the porosity treatment process, the second semiconducting layer 14 is a porous semiconducting layer 14'. Thus, the monolithic growth stacks 10 are formed from a first semiconducting layer 12 and a third semiconducting layer 16 with a porous semiconducting layer 14' provided between the first and third semiconducting layers 12, 16.

Figure 4:
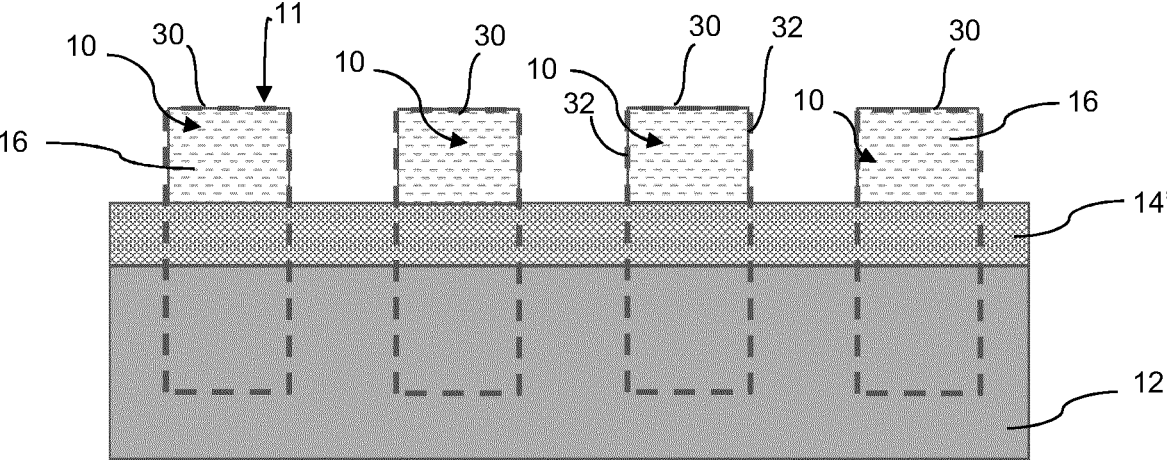
FIG. 4 shows a diagram of a plurality of monolithic growth stacks according to embodiments of the disclosure.

In the method according to the first embodiment, the third semiconducting layer 16 is further processed in order to define mesa structures for each LED precursor 1 of the LED array precursor. In the method of forming the first embodiment, the mesa structures are formed after the porosity treatment process. Of course, in other embodiments, the porosity treatment process could be performed after the formation of the mesa structures. As shown in FIG. 4, a plurality of monolithic growth stacks 10 are thus provided; one monolithic growth stack 10 for each LED precursor 1 of the LED array precursor.

As shown in FIG. 4, a plurality of monolithic growth stacks 10 are formed (indicated by the dashed line in FIG. 4). The plurality of monolithic growth stacks 10 are spaced apart from each other to form an array of monolithic growth stacks 10. The array of monolithic growth stacks 10 may be spaced apart across the first semiconducting layer 12 in a two-dimensional array. The plurality of monolithic growth stacks 10 may be spaced apart in a two-dimensional array with, for example, a square packing arrangement, or alternatively a hexagonal packing arrangement. The array of monolithic growth stacks 10 define the arrangement of the LED precursors in the LED array precursor. As such, it will be appreciated that methods according to the first embodiment may be used to fabricate a plurality of LED precursors arranged as an array across the first semiconducting layer 12.

As shown in FIG. 4, the monolithic growth stacks 10 of the first embodiment are formed by selectively removing a portion of the third semiconducting layer 16 from the growth surface 11 through a thickness of the third semiconducting layer 16. Accordingly, the growth surface 11 of each the monolithic growth stacks 10 comprises a mesa surface 30 of the third semiconducting layer 16 and a sidewall surface 32 of the third semiconducting layer 16 encircling the mesa surface 30. In FIG. 4 the third semiconducting layer 16 is selectively removed through its entire thickness (in a thickness direction normal to the growth surface 11) such that the growth surface 11 of the monolithic growth stack 10 comprises a surface of the porous semiconducting layer 14'. As such, the growth surface 11 of the monolithic growth stack 10 is shaped to define a mesa structure comprising the third semiconducting layer 16.

According to the method of the first embodiment, the selective removal process is performed prior to the heat treatment process. By performing the selective removal process prior to the heat treatment process, each of the mesa structures are provided with an additional volume of space between each mesa structure into which the third semiconducting layer 16 may strain relax during the heat treatment process. By providing the third semiconducting layer 16 with additional volume into which it can strain relax, the increase in the in-plane lattice constant of the mesa surface may be further increased. This in turn may reduce the strain formed when forming the active layer of the device, thereby improving the LED efficiency.

The mesa structures of the third semiconducting layer 16 may be shaped using a selective removal process. As such, portions of the third semiconducting layer 16 may be selectively removed to form the mesa structure shown in FIG. 4. For example, in FIG. 4 the growth surface 11 may be shaped using an etching process. In the etching process, a mesa-defining mask layer (not shown) may be deposited on the surface of third semiconducting layer 16. The mesa-defining mask layer may be configured to mask portions of the third semiconducting layer 16, which are intended to form the mesa surfaces 30 of the monolithic growth stacks 10. Un-masked portions of the third semiconducting layer 16 may then be selectively removed using an etchant. The etchant may etch away portions of the third semiconducting layer 16 to expose a surface of the porous semiconducting layer 14'. Of course, in other embodiments the etchant may not etch completely through the thickness of the third semiconducting layer to expose the porous semiconducting layer 14' below. The mesa-defining mask layer may then be removed from the third semiconducting layer 16. By following the above process, the third semiconducting layer 16 may be shaped to provide a growth surface 11 comprising a mesa surface 30 and sidewall surfaces 32 formed by the third semiconducting layer 16.

The mesa surface 30 of each monolithic growth stack may have any shape desired. The shape of each mesa surface 30 may be determined by the shape of the mesa-defining mask layer. For example, the mesa surface 30 may have an elliptical shape, a triangular shape, a rectangular shape, or a hexagonal shape, or indeed any regular or irregular polygon. In some embodiments, each mesa surface 30 of the LED array precursor may have the same shape, thereby providing a relatively uniform array of monolithic growth stacks. Of course, in other embodiments, the mesa surfaces 30 may have different shapes.

The shape of the mesa surface 30 (i.e. the perimeter of the mesa surface 30) influences the shape of the sidewall surface 32 of the third semiconducting layer 16. For example, where the mesa surface 30 has an elliptical shape, the sidewall surface 32 may be provided as a single continuous surface. In other embodiments, for example where the mesa surface 30 has a regular or irregular polygon shape, there may be a plurality of sidewall surfaces 32, with one surface corresponding to each side of the regular or irregular polygon shape of the mesa surface 30.

In FIG. 4, the monolithic growth stacks 10 are shown with sidewall surfaces 32 which extend substantially perpendicular to the mesa surface 30 of the third semiconducting layer 16. In other embodiments, the sidewall surfaces of the mesa structures may be formed with a different angle inclination with respect to the mesa surface 30. That is to say, the sidewall surfaces 30 may be inclined. As such, the mesa structures formed by the third semiconducting layer 16 may have a trapezoidal cross-section in a plane normal to the mesa surface 30.

In the diagram of FIG. 4, the mesa structures may extend from the porous semiconducting layer 14' by a distance of no greater than 100 μm. As such, in some embodiments the third semiconducting layer 16 may have a thickness in a direction normal to the mesa surface of no greater than 10 μm. In particular, in some embodiments, the mesa structures may extend from the porous semiconducting layer 14' by a distance between 1 µm and 5 µm. Accordingly, in some embodiments the third semiconducting layer 16 may have a thickness in a direction normal to the mesa surface of around 1 µm to 5 µm.

In some embodiments of the disclosure, the mesa surfaces 30 may each have surface area dimensions of at least 1 µm×1 µm. Accordingly, for the mesa surfaces to fully relax, elastic deformation mechanisms will not be sufficient. That is to say, the propagation of misfit dislocations may provide a mechanism by which the mesa surfaces can strain relax to the desired lattice constant. Importantly, the presence of the porous semiconducting layer 14' provides a region in which misfit dislocations preferentially propagate as half loop dislocations, thereby provided mesa structures with a reduced defect density. Further information on misfit dislocations at Group III-nitride heterointerfaces may be found in at least "Basal-plane Slip in InGaN/GaN Hetero Structures in the Presence of Threading Dislocations, Applied Physics Letters, vol. 90, 2007.

In some embodiments, the mesa surface 30 may each have surface area dimensions of no greater than 100 µm×100 µm.

Following the formation of the mesa structures in the third semiconducting layer 16, the layers of the monolithic growth stack are subjected to a heat treatment process in order to increase an in plane lattice constant of the growth surface of the monolithic growth stack 10.

The heat treatment process comprises heating the third semiconducting layer 16 of the monolithic growth stacks 10 to a strain relaxing temperature. The strain relaxing temperature causes the third semiconducting layer 16 to strain relax on the porous semiconducting layer 14'. Accordingly, following the heat treatment process the in-plane lattice constant of the growth surface 11 of the third semiconducting layer 16 will have increased.

The heat treatment process allows the third semiconducting layer 16 to strain relax such that the in-plane lattice constant of the third semiconducting layer 16 increases relative to the in-plane lattice constant of the as deposited third semiconducting layer 16.

In some embodiments the heat treatment process comprises heating the third semiconducting layer 16 from room temperature to a strain relaxing temperature. The strain relaxing temperature is a temperature sufficient to cause deformation of the compressively strained third semiconducting layer 16. For example, in some embodiments the strain relaxing temperature may be a temperature of at least 500° C. As such, the third semiconducting layer may be heated to a temperature wherein the third semiconducting layer releases the mechanical potential energy arising from its being compressed. Strain relaxation of the third semiconducting layer 16 may result in the formation of (misfit) dislocations towards the interface between the third semiconducting layer 16 and the second semiconducting layer 14. As a result of the heat treatment process, strain relaxation may occur via the propagation of misfit dislocation substantially across the c-plane of the porous semiconducting layer 14' towards the interface, or at the interface between the porous semiconducting layer 14' and the third semiconducting layer 16 (i.e. misfit dislocation glide in a c-plane), rather than in a direction transverse to the c-plane. The propagation of dislocations relieves at least some of the strain in the as-formed third semiconducting layer 16 such that the third semiconducting layer 16 strain relaxes. As such, the third semiconducting layer 16 strain relaxes through the propagation of misfit dislocations rather than through the propagation of threading dislocations. Consequently, the heat treatment process may reduce the strain in a region of the third semiconducting layer 16 above a narrow band in which the dislocations propagate. The presence of voids and dangling bonds in the porous semiconducting layer 14' improves the propagation of misfit dislocations in the porous semiconducting layer 14'. As such, the third semiconducting layer 16 effectively strain relaxes (i.e. slides) on top of the porous semiconducting layer 14'. Further discussion of the propagation of misfit dislocations may be found in at least Mei et al., Basal-plane Slip in InGaN/GaN Hetero Structures in the Presence of Threading Dislocations, Applied Physics Letters, vol. 90, 2007, and Floro J. A. et al., Misfit Dislocation Formation in the AlGaN/GaN Heterointerface, Journal of Applied Physics, vol. 96, 2004.

It will be appreciated that in embodiments where the third semiconducting layer 16 forms a coherent interface with the second semiconducting layer 14, the heat treatment process causes the interface between the second and third semiconducting layers 14, 16 to no longer be a coherent interface.

The heat treatment process may be provided by any suitable method for annealing a material. For example, the heat treatment step may be provided by heating the third semiconducting layer 16 from room temperature up to a first strain relaxing temperature. The third semiconducting layer 16 may be held at the first strain relaxing temperature for a first time period. The third semiconducting layer 16 may then be cooled back to room temperature. The heat treatment step may be performed in air, for example on a hotplate, or in an oven. The heat treatment process may also be performed in a controlled atmosphere. In a controlled atmosphere, atmospheric compounds such as oxygen and water may be significantly reduced or excluded entirely. For example a controlled atmosphere may be a $NH_3$, Ar, or $N_2$ atmosphere. In some embodiments, the heat treatment process may be formed under a controlled atmosphere comprising $N_2$ and $NH_3$. Performing the heat treatment process under a controlled atmosphere may reduce or eliminate any undesirable chemical reactions from occurring on the surface of the third semiconducting layer 16 during the heat treatment process. For example, in some embodiments, the heat treatment process may be performed immediately prior to the process for forming the monolithic LED stack (i.e. in situ in a MOCVD reactor).

In some embodiments, the heat treatment process may heat the third semiconducting layer to a first strain relaxed temperature of at least 500° C. In some embodiments, the first strain relaxing temperature may be at least 800° C., 950° C., 1000° C., or 1050° C. The first time period may be at least 5 minutes. In some embodiments, the first time period may be at least: 10 minutes, 20 minutes, 30 minutes or 1 hour. For example, in some embodiments, a heat treatment step may comprise heating the third semiconducting layer 16 to 800° C. and holding the third semiconducting layer at this temperature for 1 hour followed by cooling to room temperature. At higher first strain relaxing temperatures, the first time period may be reduced.

By performing the heat treatment step following the porosity treatment process, the misfit dislocations which propagate at the interface between the third semiconducting layer 16, and the second semiconducting layer 14 are able to propagate more easily due to the presence of the pores in the second semiconducting layer 14.

Next, a monolithic LED stack 20 may be formed on the growth surface 11 of each of the monolithic growth stacks 10.

Figure 5:
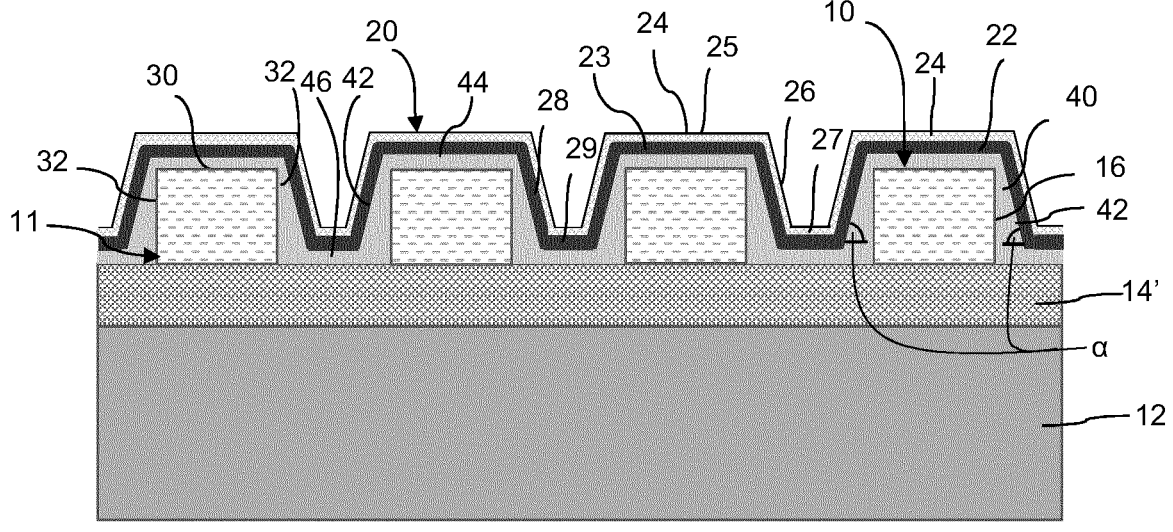
FIG. 5 shows a diagram of a plurality of LED precursors according to a first embodiment of the disclosure.

A monolithic LED stack 20 is formed on the growth surface 11 for each LED precursor 1. As shown in FIG. 5, the monolithic LED stack 20 covers the mesa surface 30 and the sidewall surfaces 32. The monolithic LED stack 20 comprises a plurality of layers, wherein each layer comprises a Group III-nitride. In some embodiments, the Group III-nitride layers comprise one or more of AlInGaN, AlGaN, InGaN, and GaN. In the first embodiment as shown in FIG. 5, the monolithic LED stack 20 comprises a fourth semiconducting layer 40, an active layer 22, and a p-type semiconducting layer 24.

As shown in FIG. 5, a fourth semiconducting layer 40 is formed on the growth surface 11 of the monolithic growth stack 10. Accordingly, the fourth semiconducting layer 40 covers the mesa surface 30 of the third semiconducting layer 16 and the sidewall surface 32 of the third semiconducting layer 16. As such, the fourth semiconducting layer 40 is formed on the third semiconducting layer 16 on an opposite side of the third semiconducting layer 16 to the porous semiconducting layer 14'.

The fourth semiconducting layer 40 may be formed on the growth surface 11 by any suitable method for the growth of Group III-nitrides. In the embodiment of FIG. 5, the fourth semiconducting layer 40 is formed monolithically over the growth surface 11 (i.e. an overgrowth method). As shown in FIG. 5, the fourth semiconducting layer 40 may be formed as a generally continuous layer covering substantially the entire growth surface 11.

As shown in FIG. 5, the fourth semiconducting layer 40 is formed on the growth surface 11 such that it forms generally inclined sidewall portions 42 extending from a mesa portion 44 of the fourth semiconducting layer 40 on the mesa surface 30 of the third semiconducting layer 16 towards the porous semiconducting layer 14'. The fourth semiconducting layer 40 also includes a bulk portion 46 which extend over the surface of the porous semiconducting layer 14' between the inclined sidewall portions 42 of each monolithic LED precursor 1.

Accordingly, the fourth semiconducting layer 40 can be overgrown on the mesa structure of the third semiconducting layer 16 to provide a Group III-nitride semiconducting layer comprising a fourth semiconducting layer mesa surface 44 surrounded by an inclined sidewall surface 42. As such, the fourth semiconducting layer 40 may be overgrown on the mesa structure of the third semiconducting layer 16 to form a column having a regular trapezoidal cross-section in a plane normal to the mesa surface 30, wherein the fourth semiconducting layer mesa surface 44 forms a substantially flat upper surface of the trapezoidal cross-section. By regular trapezoidal cross-section it is meant that the column is narrower at the top than the bottom and it has a substantially flat upper surface with slopes at the sides. This may result in a frustroconical shape, or a frustropyramidal shape having three or more sides, typically six sides.

In some embodiments, for example as shown in FIG. 5, the sidewall portions 42 of the fourth semiconducting layer 40 have a substantially consistent angle ($\alpha$) to a plane parallel to the mesa surface 30 of the growth surface 11. That is to say, the angle $\alpha$ between the sidewall surfaces of the fourth semiconducting layer 42 and a plane parallel to the mesa surface 30 do not change significantly. For example, in some embodiments the angle $\alpha$ may be at least 50 degrees at no greater than 70 degrees, and in some embodiments the angle $\alpha$ may be between 58 degrees and 64 degrees.

Accordingly, in some embodiments the sidewall portions of the fourth semiconducting layer 42 may be inclined with respect to the (0001) plane of the crystal structure of the third semiconducting layer 16. The inclined sidewalls may be generally orientated along the $\{1\ \bar{1}\ 0\ 1\}$ or $\{1\ \bar{1}\ 0\ 2\}$ planes of the wurtzite crystal and present reduced polarisation fields compared with C-plane surfaces (semi-polar surfaces).

Alternatively, for example as discussed in relation to the second embodiment, the fourth semiconducting layer 40 may be formed as a generally discontinuous layer which covers the mesa surface 30 and the sidewall surface 32 of each monolithic growth stack 10 and extends over a region of the porous semiconducting layer 14' surrounding the mesa structure of the third semiconducting layer 16. The fourth semiconducting layer 40 may be deposited using any suitable process for the fabrication of Group III-nitride films, for example MOCVD, or MBE.

The fourth semiconducting layer 40 comprises a Group III-nitride. In the embodiment of FIG. 5, the fourth semiconducting layer 40 comprises GaN. In some embodiments, the fourth semiconducting layer 40 may be n-type doped. The fourth semiconducting layer 40 may be n-type doped using a suitable dopant, for example, Si, or Ge. In the embodiment of FIG. 5, the fourth semiconducting layer 40 is not intentionally doped. As such, the fourth semiconducting layer 40 may be a (substantially) undoped layer. By substantially undoped, it is understood that the Group III-nitride does not include any significant quantity of dopant elements, whilst appreciating that some impurities may be present as a result of the fabrication process. By forming the fourth semiconducting layer 40 from an undoped semiconductor, the flow of charge carriers through the LED precursor may be more efficiently confined in the mesa structure.

By growing the fourth semiconducting layer 40 on the growth surface provided by the third semiconducting layer 16, the fourth semiconducting layer 40 may have a crystal structure which is coherent with the crystal structure of the third semiconducting layer 16. For example, where the mesa surface 30 of the third semiconducting layer 16 is aligned with the (0001) plane of a Group III-nitride, the fourth semiconducting layer 40 formed on the mesa surface 30 may form a coherent interface and have a similar (0001) crystal orientation. As such, in-plane lattice constant of the fourth semiconducting layer 40 on the mesa surface 30 may correspond to the in-plane lattice constant of the third semiconducting layer 16 at the mesa surface 30.

As shown in FIG. 5, an active layer 22 may then be formed on the fourth semiconducting layer 40. The active layer 22 is configured to generate light of a first wavelength as part of the monolithic LED stack 20.

The active layer 22 is configured to generate light of a first wavelength as part of the monolithic LED stack 20. In the embodiment of FIG. 5, the active layer 22 may comprise one or more quantum well layers (not shown). As such, the active layer 22 may be a multiple quantum well layer. The quantum well layers within the active layer 22 may each comprise a Group III-nitride semiconductor, for example a Group III-nitride alloy comprising In. In the embodiment of FIG. 5, the active layer 22 comprises alternating layers of GaN and $In_ZGa_{1-Z}Z$, where $0<Z\leq1$. In particular, in some embodiments the active layer may comprise $In_ZGa_{1-Z}N$ layers where $0.2\leq Z\leq0.5$. As such, the active layer 22 of the monolithic LED stack may be configured to output light having a wave length of at least 525 nm. The thickness and In content of the quantum well layers may be controlled in order to control the wavelength of the light generated by the active layer 22. The active layer 22 may be formed as a continuous layer covering a substantial portion of the exposed growth surface. The active layer 22 may be deposited using any suitable process for the fabrication of Group III-nitride thin films, for example MOCVD or MBE.

In some embodiments, the active layer 22 may comprise a strain interface layer (not shown). The strain interface layer may be formed between the growth surface 11 and the multiple quantum well structure, as is known in the art.

The deposition of the active layer 22 on the fourth semiconductor layer 40 may occur with a relatively high deposition rate on the mesa portion of the fourth semiconducting layer 44, and with a significantly lower deposition rate on the inclined sidewall portions of the fourth semiconducting layer 42. This effect results from the different crystal plane alignment of the various surfaces, resulting in a thicker active layer 22 over the mesa surface 30 than on the inclined sidewall portions 42. This effect is described in more detail in GB1811190.6.

Accordingly, the active layer 22 may include an active layer mesa portion 23 which extends over the mesa portion 44 of the fourth semiconducting layer 40. The active layer 22 may also include active layer sidewall portions 28 which extend over the sidewall portions 42 of the fourth semiconducting layer 40. The active layer sidewall portions 28 encircle the active layer mesa portion 23 and extend from the active layer mesa portion 23 towards the porous semiconducting layer 14'. As such, the active layer sidewall portions 28 are generally aligned with the inclined sidewall portions of the fourth semiconducting layer 42. The active layer 22 may also include active layer bulk portions 29 which extend over the bulk portions 46 of the fourth semiconducting layer 40 between the active layer sidewall portions 28 of each monolithic LED precursor 1.

It will be appreciated that various methodologies for forming a monolithic LED stack 20 comprising an active layer 22 are known to the skilled person. Accordingly, it will be appreciated that the methodology described in relation to FIGS. 1 to 5 is only one example of a possible methodology of forming a monolithic LED stack 20. For example, in the embodiment of FIG. 5 the active layer 22 may have a thickness in a direction generally normal to the growth surface of at least 30 nm and no more than 150 nm. In some embodiments, the active layer 22 may have a thickness in the thickness direction of at least 40 nm and not greater than 60 nm.

Further layers of the monolithic LED stack 20 may then be deposited on the active layer 22 on an opposite side of the active layer 22 to the monolithic growth stack 10. For example, as shown in FIG. 5 the p-type semiconducting layer 24 is subsequently formed on the active layer 22.

As shown in FIG. 5 a p-type semiconducting layer 24 is provided on the active layer 22. The p-type semiconducting layer 24 comprises a Group III-nitride. The p-type semiconducting layer 24 is doped with a suitable electron acceptor, for example Mg. The p-type semiconducting layer 24 may be formed as a substantially continuous layer covering a substantial portion (e.g. all) of the exposed surface of the active layer 24. The p-type semiconducting layer may be formed using any suitable process for the fabrication of Group III-nitride thin films, for example MOCVD or MBE.

As shown in FIG. 5, the p-type semiconducting layer 24 is formed on the exposed surface of the active layer 22. As such, in the embodiment of FIG. 5, the p-type semiconducting layer 24 is a generally continuous layer. Of course, in other embodiments, the p-type semiconducting layer 24 may be formed as a discontinuous layer.

The p-type semiconducting layer 24 may have a thickness (in a thickness direction normal to the mesa surface 30) of at least: 50 nm, 60 nm, 70 nm, 80 nm or 100 nm. Further, the p-type semiconducting layer 24 may have a thickness of no greater than: 300 nm, 250 nm or 200 nm. For example, in the embodiment of FIG. 5 the p-type semiconducting layer 24 may have a thickness of around 100 nm.

The p-type semiconducting layer 24 for each LED precursor may comprise a p-type mesa portion 25 and one or more p-type sidewall portions 26. The p-type mesa portion 25 may be substantially aligned with the mesa surface 30 of the monolithic growth stack 10. The p-type sidewall portion 26 encircles the p-type mesa portion 25 and extends from the p-type mesa portion 25 towards the porous semiconducting layer 14'. As such, the p-type sidewall portions 26 are generally aligned with the inclined sidewall portions of the fourth semiconducting layer 42. The p-type semiconducting layer 24 may also include a p-type bulk portion 27 which extends over the active layer bulk portion 29 between the p-type sidewall portions 26 of each monolithic LED precursor 1.

Accordingly, FIG. 5 shows an embodiment of an LED array precursor according to this disclosure. The LED array precursor may be fabricated according to the method set out in the described above. In accordance with the definition of the term precursor in this disclosure, it will be appreciated that the LED array precursor of FIG. 5 may be subjected to further fabrication steps in order to form electrical contacts to each of the LED precursors. Accordingly, it will be appreciated that the LED array precursor may be subjected to further fabrication steps in order to provide an LED and/or an LED array.

For example, in order to provide for the independent control of one of the monolithic LED precursors according to the first embodiment, a portion of at least the p-type mesa portion 25, or the p-type sidewall portions 26 encircling the mesa surface 30 may be selectively removed. Thus, the p-type mesa portion 25 of each monolithic LED precursor 1 may be provided with electrical power (i.e. current/voltage) independently of other p-type mesa portions 25. Such a selective removal process may be performed as part of the process of forming electrical contacts to the monolithic LED precursors 1.

In particular, in some embodiments the monolithic growth stacks 10 may be sized in order to provide a micro LED precursor and/or a micro LED array precursor. For example, in some embodiments the monolithic LED stack 20 of each micro LED precursor may have a footprint on the first semiconducting layer 12 of less than 100 µm×100 µm. As such, each LED precursor may be a micro LED precursor wherein the monolithic LED stack 20 has a surface area dimension in a plane aligned with the first semiconducting layer 12 of less than 100 µm×100 µm.

In accordance with the methodology set out with reference to FIGS. 1 to 5 a LED precursor 1 is provided. As such, an embodiment of an LED precursor 1 according to this disclosure is shown in FIG. 5. The LED precursor 1 of FIG. 5 comprises a monolithic growth stack 10 and a monolithic LED stack 20. The monolithic growth stack 10 comprises a first semiconducting layer 12, a second semiconducting layer 14, and a third semiconducting layer 16. The monolithic LED stack comprises an active layer 22 and p-type semiconducting layer 24. Each of the layers of the monolithic growth stack 10 and monolithic LED stack 20 may have properties in accordance with the discussion of the method of forming the LED precursor 1 described above.

According to a second embodiment of the disclosure, a LED precursor 1 is provided. In some embodiments, a plurality of LED precursors 1 arranged to form a LED array precursor may be provided. For example, a LED array precursor comprising a plurality of LED precursors according to the second embodiment may be formed using a methodology as shown in FIGS. 3, 6, and 7.

The method according to the second embodiment of the disclosure comprises forming a monolithic growth stack 10 and a monolithic LED stack 20 for each LED precursor 1. Similar to the first embodiment, the monolithic LED stacks 20 are formed on a growth surface 11 of a respective monolithic growth stack 10. Like features of the first, second embodiments have corresponding reference numerals. FIG. 3 shows a diagram of the layers used to form the monolithic growth stacks 10 of the second embodiment. As shown in FIG. 3, the monolithic growth stacks 10 are formed form a first semiconducting layer 12, a porous semiconducting layer 14' and a third semiconducting layer 16. As discussed previously, the porous semiconducting layer 14' in FIG. 3 has been formed from a second semiconducting layer 14 which has been subjected to a porosity treatment process.

Similar to the method of the first embodiment, the third semiconducting layer 16 is subjected to a selective removal process prior to the heat treatment process in order to form a plurality of mesa structures. Each mesa structure formed using the selective removal step may be used to define a LED precursor of the LED array precursor. The mesa structures may be arranged in a two-dimensional array as discussed for the first embodiment above. The method of the second embodiment differs from the method of the first embodiment, in that the selective removal step removes a portion of the third semiconducting layer 16 and a portion of the porous semiconducting layer 14' encircling each of the mesa structures.

Figure 6:
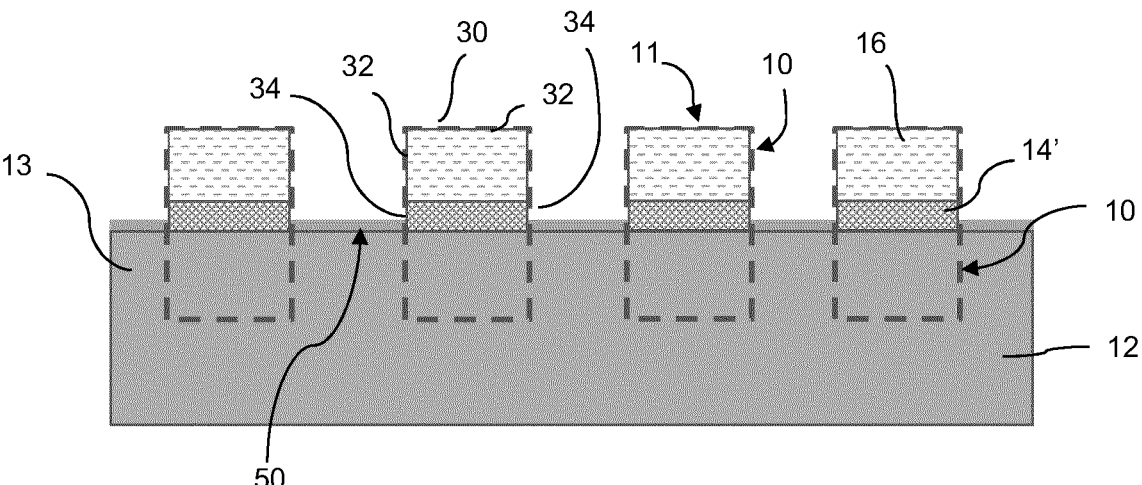
FIG. 6 shows a diagram of a plurality of monolithic growth stacks according to a second embodiment of the disclosure.
Figure 7:
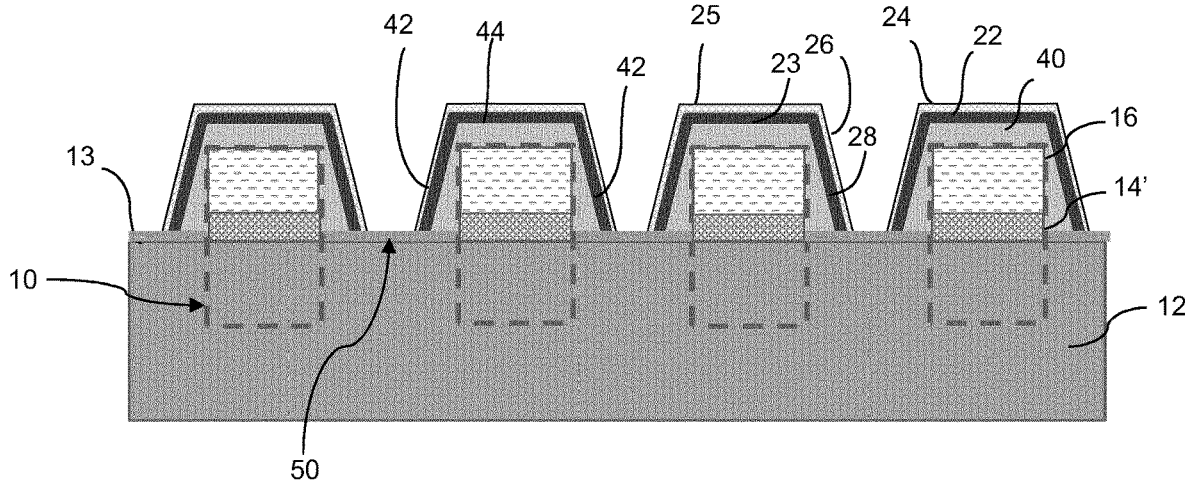
FIG. 7 shows a diagram of a plurality of LED precursors according to a second embodiment of the disclosure.

For example, as shown in FIG. 6, the selective removal process has selectively removed a portion of the third semiconducting layer 16 from the growth surface 11 through a thickness (in a thickness direction normal to the mesa surface 30) of the third semiconducting layer 16 and through a thickness of the porous semiconducting layer 14'. Accordingly, the growth surface 11 of each of the monolithic growth stacks 10 comprises a mesa surface of the third semiconducting layer 16, a sidewall surface 32 of the third semiconducting layer 16 and a porous sidewall surface 34 of the porous semiconducting layer 14'. Accordingly, as shown in FIG. 6 the third semiconducting layer 16 and the porous semiconducting layer 14' are selectively removed through their entire thicknesses such that the first surface 13 of the first semiconducting layer 12 is exposed between each of the mesa structures. The selective removal process may be performed using an etchant in a similar manner to the selective removal process discussed above for the first embodiment. In some embodiments, the selective removal process may also selectively remove portions of the first semiconducting layer 12. As such, the mesa structure may be defined by the monolithic growth stack 10 (indicated in dashed lines in FIG. 6).

Similar to the first embodiment, the shape of the mesa surfaces 30 in the third embodiment may have any suitable shape. Furthermore, the sidewall surfaces 32 and the porous sidewall surfaces 34 may be formed with any angle of inclination with respect to the mesa surfaces 30. As such, the mesa structures formed by the third semiconducting layer 16 and the porous semiconducting layer 14' may have a trapezoidal cross-section in a plane normal to the mesa surface 30.

Following the formation of the mesa structures, a heat treatment process is performed. The heat treatment process may be performed substantially as described for the first embodiment. The heat treatment process allows the third semiconducting layer 16 to strain relax wherein an in-plane lattice constant of the growth surface increases. Following the strain relaxation, the interface between the third semiconducting layer 16 and the porous semiconducting layer 14' is no longer coherent.

Next, a monolithic LED stack 20 may be formed on the growth surface 11 of each of the monolithic growth stacks 10.

In some embodiments, the monolithic LED stacks 20 may be grown as substantially continuous layers, for example as described above in relation to the first embodiment.

In other embodiments, for example as shown in the second embodiment, the monolithic growth stacks 20 may be formed as generally discontinuous layers.

As shown in FIG. 6, following the formation of the monolithic growth stacks 10, a masking layer 50 is provided over the exposed surface of the porous semiconducting layer 14'. The masking layer 50 is configured to prevent, or significantly reduce, growth of the fourth semiconducting layer 40 nucleating on (i.e. starting on) the masking layer 50. The masking layer is configured to restrict the growth surface 11 of each monolithic growth stack 10 to the mesa surface 30 and the sidewall surfaces of the monolithic growth stack 10. As such, the masking layer 50 in the second embodiment is configured to reduce, or prevent, the formation of the bulk portions 46 of the fourth semiconducting layer 40. Accordingly, the use of a masking layer 50 is one example of a method of forming discontinuous monolithic LED stacks 20.

In some embodiments, the masking layer 50 may be formed from $SiO_2$, $SiN_x$, or any other suitable masking material such as a dielectric material (i.e. a dielectric layer). In some embodiments, the masking layer 50 may have a thickness in a direction normal to the mesa surface 30 of at least 50 nm. In some embodiments, a thickness in the direction normal to the mesa surface 30 of the masking layer 50 may be no greater than 500 nm.

Next, the monolithic Led stacks 20 may be formed on the (discontinuous) growth surface 11 of the array of monolithic growth stacks 10. The resulting structure is shown in FIG. 7. The fourth semiconducting layer 40 is formed on the growth surface 11 such that it forms a generally inclined sidewall portion 42 extending from a mesa portion 44 of the fourth semiconducting layer 40 on the mesa surface 30 of the third semiconducting layer 16 towards the porous semiconducting layer 14'. The fourth semiconducting layer 40 does not grow, or grows at a significantly reduced rate on the masking layer 50. It will be appreciated that the regions of the fourth semiconducting layer 40 which overlap the masking layer 50 result from growth of the fourth semiconducting layer 40 extending from the sidewall surfaces 32 of the mesa structure.

Accordingly, the fourth semiconducting layer 40 can be overgrown on the mesa structure of the third semiconducting layer 16 to provide a Group III-nitride semiconducting layer comprising a fourth semiconducting layer mesa surface 44 surrounded by an inclined sidewall surface 42. As such, the fourth semiconducting layer 40 may be overgrown on the mesa structure of the third semiconducting layer 16 to form a column having a regular trapezoidal cross-section in a plane normal to the mesa surface 30, wherein the fourth semiconducting layer mesa surface 44 forms a substantially flat upper surface of the trapezoidal cross-section. By regular trapezoidal cross-section it is meant that the column is narrower at the top than the bottom and it has a substantially flat upper surface with slopes at the sides. This may result in a frustroconical shape, or a frustropyramidal shape having three or more sides, typically six sides.

The fourth semiconducting layer 40 may be formed from a similar material as used in the first embodiment, and using similar process as discussed above.

The active layer 22 and the p-type semiconducting layer 25 may then be formed on the fourth semiconducting layer 40.

As shown in FIG. 7, the active layer 22 includes an active layer mesa portion 23 and active layer sidewall portions 28 for each monolithic LED precursor 1. The active layer 22 may be formed using similar processes as described for the first embodiment.

As shown in FIG. 7, the p-type semiconducting layer 24 includes a p-type mesa portion 25 and p-type sidewall portions 26. The p-type semiconducting layer 24 may be formed using similar processes as described for the first embodiment.

Accordingly, an LED array precursor comprising a plurality of LED precursors 1 according to a second embodiment of the disclosure may be formed by the above described method.

Figure 8:
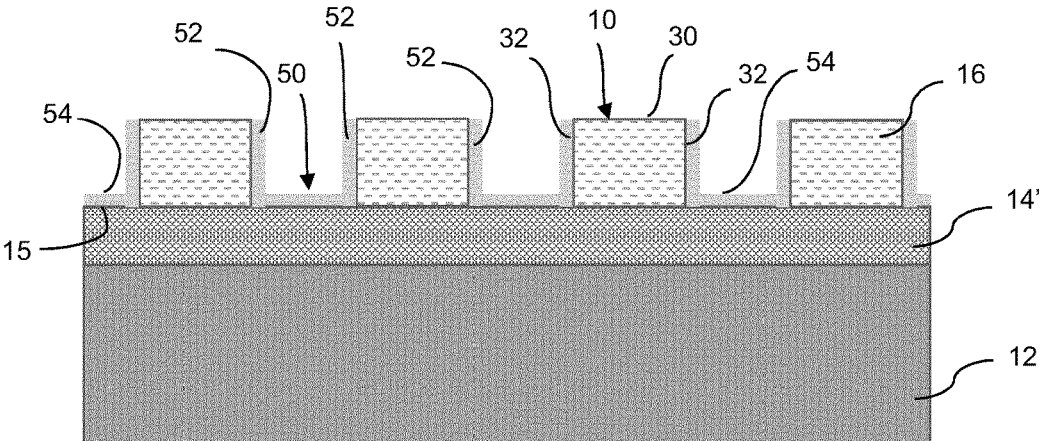
FIG. 8 shows a diagram of a plurality of monolithic growth stacks according to a third embodiment of the disclosure.
Figure 9:
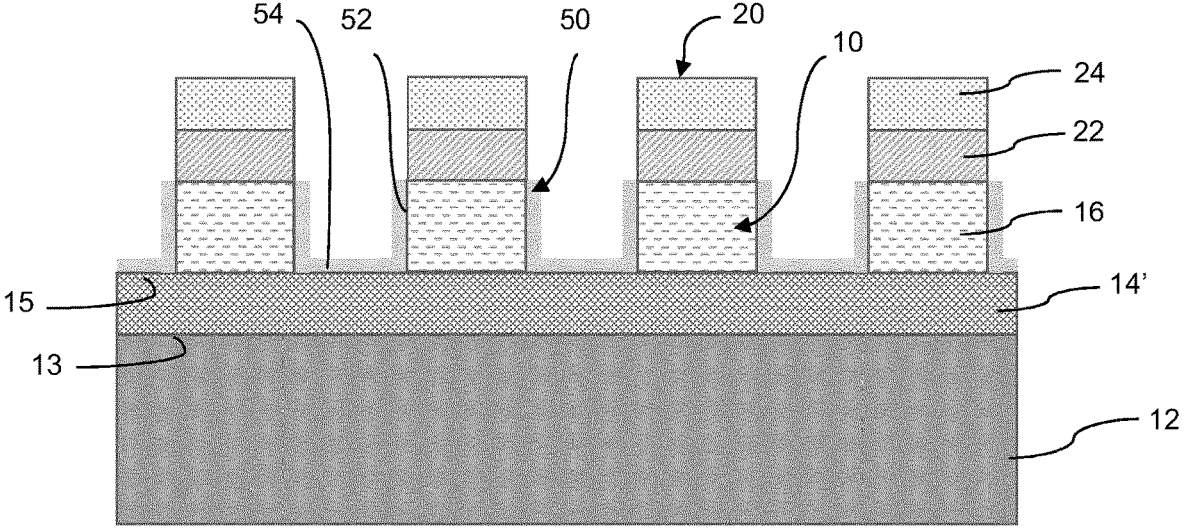
FIG. 9 shows a diagram of a plurality of LED precursors according to a third embodiment of the disclosure.

According to a third embodiment of the disclosure, a method of forming an LED array precursor comprising a plurality of LED precursors 1 is provided. FIGS. 3, 8, and 9 show diagrams of explaining a process of forming the LED array precursor according to the third embodiment. The method according to the third embodiment comprises forming a monolithic growth stack 10 and a monolithic LED stack 20 for each LED precursor. Similar to the first and second embodiments, the monolithic LED stacks 20 are formed on a growth surface 11 of a respective monolithic growth stack 10. Like features of the first, second, and third embodiments have corresponding reference numerals. As discussed previously, FIG. 3 shows a diagram of the layers used to form the monolithic growth stacks 10. As shown in FIG. 3, the second semiconducting layer 14 has been subjected to a porosity treatment process such that the second semiconducting layer 14 is a porous semiconducting layer 14'.

In the method according to the third embodiment, the third semiconducting layer 16 is further processed in order to define mesa structures for each LED precursor. According to the method of the third embodiment, the selective removal process may be performed substantially as described in relation to FIG. 4 and the first embodiment, or substantially as described in relation to FIG. 6 and the second embodiment of the disclosure. The following description will focus on the selective removal process performed according to the first embodiment and as shown in FIG. 4 although the skilled person will appreciate that the method of the fourth embodiment is equally applicable to the selective removal process described in relation to the third embodiment.

Following the selective removal step, the monolithic growth stacks 10 are subjected to a heat treatment process in order to strain relax the third semiconducting layer 16. The heat treatment process may be performed substantially as described above in relation to the other embodiments of disclosure.

Following the heat treatment step, a masking layer may be selectively formed on the growth surface 11 of the monolithic growth stacks 10, wherein the masking layer 50 comprises an aperture aligned with the mesa surface 30 of each monolithic growth stack 10. As such, the masking layer 50 is provided to cover the sidewall surfaces 32 of each mesa structure, but not cover the mesa surface 30 of the third semiconducting layer 16. Effectively, the masking layer acts to restrict the growth of the monolithic LED stack to the exposed mesa surfaces 30 of each monolithic growth stack 10.

For example, as shown in FIG. 8 the masking layer 50 is formed on the sidewall surfaces of the third semiconducting layer 32 and also on the porous surface 15 of the porous semiconducting layer 14'. As such, the masking layer 50 comprises sidewall portions 52 which cover the sidewall portions of the third semiconducting layer 16 and infill portions 54 which extend across the previously exposed surface of the porous semiconducting surface 15. It will be appreciated that in the embodiment of FIG. 10 the masking layer 50 may be a single continuous layer comprising a plurality of apertures for each of the mesa surfaces 30 of the mesa structures. The apertures for each of the mesa surfaces 30 may be formed by the use of a mask layer to prevent the formation of the masking layer 50 on the mesa surfaces 30. For example, in some embodiments the mesa defining mask layer (not shown) used to define each of the mesa structures may also be used to define the apertures of the masking layer 50. That is to say, the selective removal process (for forming the mesa structures) and the formation of the masking layer 50 may both be performed prior to the removal of the mesa defining mask layer. Alternatively, separate mesa defining mask layers may be used for the selective removal process and the formation of the masking layer 50.

In some embodiments, the masking layer 50 may be formed from $SiO_2$, $SiN_X$, or any other suitable masking material such as a dielectric material (i.e. a dielectric layer). In some embodiments, the infill portion 54 of the masking layer 50 may have a thickness in a direction normal to the mesa surface of at least 50 nm. In some embodiments, a thickness in the direction normal to the mesa surface 30 of the infill portion of the masking layer 50 may be no greater than 500 nm. It will be appreciated that the sidewall portions 52 of the masking layer 50 may have similar thickness normal to the surface on which they are formed to the infill portions 54. Of course, it will be appreciated that due to the different orientation of the sidewall portions 54 the thickness of the sidewall portions 54 of the masking layer 50 layers may be slightly different, either thicker or thinner than the infill portions 52.

Next, a monolithic LED stack 20 may be formed on the growth surface of the monolithic growth stack 10. As shown in FIG. 9, the growth surface 11 for each monolithic growth stack 10 is restricted to the mesa surface 30. The presence of the masking layer 50 prevents, or significantly reduces, the growth of the monolithic LED stack 20 on the masking layer 50.

Accordingly, as shown in FIG. 9 the monolithic growth stack 20 is formed on each of the growth surfaces 11 of the monolithic growth stacks 10. As shown in FIG. 9, the monolithic LED stacks 20 cover each of the mesa surfaces 30. In contrast to the second and third embodiments, the monolithic LED stacks 20 do not extend over the sidewall surfaces 32 of the third semiconducting layer 16. Similar to the first, second and third embodiments, the monolithic LED stack 20 comprises a plurality of layers. Each layer of the monolithic LED stack 20 comprises a Group-III nitride. Some embodiments of the Group-III nitride layers comprise one or more of AlInGaN, AlGaN, InGaN, and GaN. In the fourth embodiment shown in FIG. 9, the monolithic LED stack 20 comprises an active layer 20 and a p-type semiconducting layer 24.

The active layer 22 may be formed using a similar method to the methods described in relation to the first, second and third embodiments.

The p-type semiconducting layer 24 may be formed in a similar manner to the p-type layer 24 as described for the first, second and third embodiments.

Accordingly, an LED array precursor comprising a plurality of LED precursors may be formed according to the method of the fourth embodiment. According to the method of the fourth embodiment, the monolithic LED stack is selectively formed on the mesa surface 30 of the monolithic growth stack 10 and not on the regions of the growth surface 11 which are covered by the masking layer 50.

The invention claimed is:

1. A method of manufacturing a LED precursor comprising:

forming a monolithic growth stack having a growth surface and comprising a first semiconducting layer, a second semiconducting layer on the first semiconducting layer, and a third semiconducting layer on an opposite side of the second semiconducting layer to the first semiconducting layer; and forming a monolithic LED stack directly on the growth surface of the monolithic growth stack, wherein:

a) forming the monolithic growth stack comprises:

forming the first semiconducting layer, the first semiconducting layer comprising a Group III-nitride;

forming the second semiconducting layer on the first semiconducting layer, the second semiconducting layer comprising a first Group III-nitride including a donor dopant such that the second semiconducting layer has a donor density of at least $5 \times 10^{18}$ cm$^{-3}$;

forming the third semiconducting layer on an opposite side of the second semiconducting layer to the first semiconducting layer, wherein the third semiconducting layer provides the growth surface of the monolithic growth stack, the third semiconducting layer comprising a second Group III-nitride different to the first Group-III-nitride such that the third semiconducting layer is formed on the second semiconducting layer under compressive strain; and selectively removing a portion of the third semiconducting layer from the growth surface through a thickness of the third semiconducting layer such that the growth surface of the monolithic growth stack comprises a mesa surface of third semiconducting layer and a sidewall surface of the third semiconducting layer encircling the mesa surface, wherein following formation of the third semiconducting layer:

the second semiconducting layer is subjected to a porosity treatment to increase an areal porosity of the second semiconducting layer to at least 15%; and the third semiconducting layer is heated to a strain relaxing temperature such that the third semiconducting layer relaxes such that an in-plane lattice constant of the mesa surface increases; and b) forming the monolithic LED stack comprises:

forming a fourth semiconducting layer comprising a Group III-nitride directly on the growth surface of the monolithic growth stack, such that the fourth semiconducting layer covers the mesa surface of the third semiconducting layer;

forming an active layer on the fourth semiconducting layer, the active layer comprising a plurality of quantum well layers, each quantum well layer comprising a Group III-nitride;

forming a p-type semiconducting layer comprising a Group III-nitride on the active layer.

2. The method according to claim 1, wherein the second semiconducting layer comprises GaN; and/or the third semiconducting layer comprises In$_X$Ga$_{1-X}$N, where 0<X≤1.

3. The method according to claim 1, wherein each quantum well layer of the active layer comprises In$_Z$Ga$_{1-Z}$n, where 0.2<Z≤0.5.

4. The method according to claim 1, wherein the second semiconducting layer is subjected to the porosity treatment prior to selectively removing a portion of the third semiconducting layer from the growth surface.

5. The method according to claim 4, wherein forming the monolithic growth stack further comprises:

selectively forming a masking layer on the growth surface of the monolithic growth stack, the masking layer comprising an aperture aligned with the mesa surface of the monolithic growth stack.

6. The method according to claim 5, wherein the monolithic LED stack is selectively formed on the mesa surface of the monolithic growth stack and not on the growth surface covered by the masking layer.

7. The method according to claim 1, wherein the third semiconducting layer is selectively removed such that the growth surface of the monolithic growth stack comprises a surface of the second semiconducting layer.

8. The method according to claim 1, wherein forming the monolithic growth stack further comprises:

selectively removing a portion of the second semiconducting layer aligned with the portion of the third semiconducting layer which is selectively removed such that the growth surface of the monolithic growth stack comprises a sidewall surface of the second semiconducting layer.

9. The method according to claim 8, wherein the second semiconducting layer is selectively removed such that the sidewall surface of the second semiconducting layer is aligned with the sidewall surface of the third semiconducting layer.

10. The method according to claim 8, wherein the second semiconducting layer is selectively removed such that the growth surface comprises a portion of a surface of the first semiconducting layer.

11. The method according to claim 1, wherein the fourth semiconducting layer comprises GaN.

12. The method according to claim 1, wherein the fourth semiconducting layer is formed on the growth surface to provide an inclined sidewall portion extending from a mesa portion of the fourth semiconducting layer on the mesa surface of the third semiconducting layer towards the second semiconducting layer.

13. A LED precursor comprising:

a monolithic growth stack having a growth surface; and a monolithic LED stack provided directly on the growth surface of the monolithic growth stack, wherein:

a) the monolithic growth stack comprises:

a first semiconducting layer comprising a Group III-nitride;

a second semiconducting layer provided on the first semiconducting layer, the second semiconducting layer comprising a first Group III-nitride including a donor dopant such that the second semiconducting layer has a donor density of at least $5 \times 10^{18}$ cm$^{-3}$, wherein the second semiconducting layer has an areal porosity of at least 15% and a first in-plane lattice constant; and a third semiconducting layer provided on an opposite side of the second semiconducting layer to the first semiconducting layer, the third semiconducting layer comprising a second Group III-nitride different to the first Group-III-nitride, wherein the monolithic growth stack comprises a mesa structure comprising the third semiconducting layer such that the growth surface comprises a mesa surface of third semiconducting layer and a sidewall surface of the third semiconducting layer encircling the mesa surface, the sidewall surface of the third semiconducting layer inclined relative to the mesa surface, wherein the mesa surface of the third semiconducting layer has a second in-plane lattice constant which is greater than the first in-plane lattice constant; and b) the monolithic LED stack comprises:

a fourth semiconducting layer provided directly on the growth surface of the monolithic growth stack, such that the fourth semiconducting layer is formed directly on the mesa surface of the third semiconducting layer and the sidewall surface of the third semiconducting layer;

an active layer provided on the fourth semiconducting layer, the active layer comprising a plurality of quantum well layers, each quantum well layer comprising a Group III-nitride; and a p-type semiconducting layer comprising a Group III-nitride provided on the active layer.

14. The LED precursor according to claim 13, wherein the second semiconducting layer comprises GaN; and/or the third semiconducting layer comprises $In_XGa_{1-X}N$, where $0<X\leq1$.

15. The LED precursor according to claim 13, wherein each quantum well layer of the active layer comprises $In_ZGa_{1-Z}N$, where $0.2<Z\leq0.5$.

16. The LED precursor according to claim 13, wherein the sidewall surface of the third semiconducting layer is inclined in a direction transverse to the mesa surface.

17. The LED precursor according to claim 13, wherein the mesa structure extends from the second semiconducting layer such that growth surface comprises the second semiconducting layer.

18. The LED precursor according to claim 13, wherein the growth surface of the monolithic growth stack comprises a sidewall surface of the second semiconducting layer aligned with the sidewall surface of the third semiconducting layer.

19. The LED precursor according to claim 18, wherein the mesa structure extends from the first semiconducting layer such that the growth surface comprises a portion of a surface of the first semiconducting layer.

20. The LED precursor according to claim 13, wherein fourth semiconducting layer comprises GaN.

21. The LED precursor according to claim 13, wherein the fourth semiconducting layer is provided on the growth surface to provide an inclined sidewall portion extending from a mesa portion of the fourth semiconducting layer on the mesa surface of the third semiconducting layer towards the second semiconducting layer.

22. The LED precursor according to claim 13, wherein the monolithic growth stack further comprises:

a masking layer provided on the growth surface of the monolithic growth stack, the masking layer comprising an aperture aligned with the mesa surface of the monolithic growth stack.

23. The LED precursor according to claim 22, wherein the monolithic LED stack is selectively provided only on the mesa surface of the monolithic growth stack.

24. The LED according to claim 13, wherein the LED precursor is a micro LED precursor wherein the monolithic LED stack has a surface area dimension in a plane aligned with the first semiconducting layer of less than 100 µm×100 µm.

25. The LED array precursor comprising:

a plurality of LED precursors according to claim 13, the plurality of LED precursors arranged in a two-dimensional array.

* * * * *